United States Patent
Suh et al.

(12)

(10) Patent No.: US 6,271,705 B1
(45) Date of Patent: *Aug. 7, 2001

(54) DATA OUTPUT CIRCUITS HAVING ENHANCED ESD RESISTANCE AND RELATED METHODS

(75) Inventors: Young-Ho Suh; Choong-Keun Kwak, both of Suwon; Sang-Jib Han, Seoul, all of (KR)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/448,534

(22) Filed: Nov. 22, 1999

Related U.S. Application Data (63) Continuation of application No. 08/963,792, filed on Nov. 4, 1997, now Pat. No. 5,994,943.

(30) Foreign Application Priority Data

Nov. 4, 1996 (KR) .............................. 1996-51903
Nov. 28, 1996 (KR) .............................. 1996-58941

(51) Int. Cl.[7] .................... H03K 5/00; H02H 3/20
(52) U.S. Cl. ...................... 327/310; 327/323; 327/328
(58) Field of Search .................... 327/310, 306, 327/545, 564, 108, 311, 309, 323, 328; 361/56, 55, 111

(56) References Cited

U.S. PATENT DOCUMENTS 5,391,948 * 2/1995 Izumita .............................. 327/310

FOREIGN PATENT DOCUMENTS 62-169464    7/1987    (JP) .

* cited by examiner

*Primary Examiner*—Dinh T. Le
(74) *Attorney, Agent, or Firm*—Myers Bigel Sibley & Sajovec (57) ABSTRACT

A data output circuit includes a periphery circuit connected between a supply voltage and a first ground voltage line and an output driver connected between a supply voltage and a second ground voltage line. The periphery circuit receives a first input signal and generates a first output signal on a node responsive to the first input signal, and the output driver receives a second input signal and the first output signal and generates a second output signal on an output pin in response thereto. A discharge circuit is coupled with the first ground voltage line wherein the discharge circuit allows current to flow from the first ground voltage line and wherein the discharge circuit blocks current flow to the first ground voltage line. Related methods are also discussed.

42 Claims, 4 Drawing Sheets

DATA OUTPUT CIRCUITS HAVING ENHANCED ESD RESISTANCE AND RELATED METHODS

This is a continuation of application Ser. No. 08/963,792, filed on Nov. 4, 1997, U.S. Pat. No. 5,994,943.

FIELD OF THE INVENTION

The present invention relates to the field of integrated circuits and more particularly to data output circuits for integrated circuit memory devices.

BACKGROUND OF THE INVENTION

An integrated circuit memory device generally includes an input circuit terminal to which external signal are applied, and an output circuit terminal for providing external output signals. When an external electrostatic capacitance provides excessive static electricity inside the memory device through the input/output circuit terminals, a supply voltage terminal, or a ground terminal, internal circuits may be damaged. In particular, MOS transistors inside the memory device typically include oxide insulating layers that may be easily damaged. Electrostatic damage to these insulating layers may result in poor performance for the MOS transistor. Various models have been developed for electrostatic discharges (ESD) wherein different models approximate the different capacitances which may produce static electricity. One such model is a charged device model (CDM) wherein charges of a strongly charged memory device are rapidly discharged through unspecified input/output pins. Such a discharge may destroy insulating layers within the device.

To provide rapid data output in a memory device, the voltage of a supply voltage line and a ground voltage line may change quickly and severely as a result of the flow of instantaneous current through data output circuits. These voltage changes may affect other periphery circuits thereby generating noise at the output terminal. The supply voltage and ground voltages lines at the output terminal of a data output circuit are thus electrically separated from the output terminals of other periphery circuits. It is thus possible to reduce the transmission of noise signals generated at the output terminal of the data output circuit to the periphery circuits along the supply voltage and ground voltage lines. This technique is discussed, for example, in Japanese Patent No. 62-169464.

Figure 1:
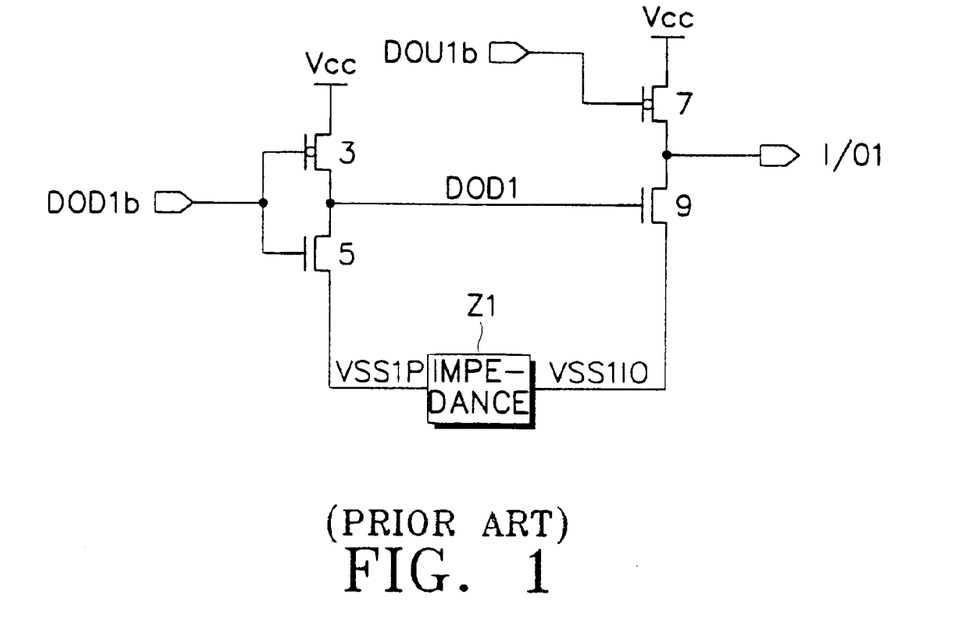
FIG. 1 is a circuit diagram of a first data output circuit according to the prior art.

FIG. 1 is a circuit diagram of a data output circuit connected to two or more divided ground lines according to the prior art. As shown in FIG. 1, the data output circuit includes an inverter of a periphery circuit wherein an input signal DOD1b is applied to an input terminal; a PMOS transistor 3 and an NMOS transistor 5 are serially connected between a supply voltage terminal Vcc and a ground voltage line VSS1P. The data output circuit also includes an output driver wherein an input signal DOU1b is applied to an input terminal; and a PMOS transistor 7 and an NMOS transistor 9 serially connected between a supply voltage terminal Vcc and a ground voltage line VSS1IO. The data output circuit further includes an impedance component Z1 connected between the ground voltage line VSS1P and the ground voltage line VSS1IO. A node DOD1 connects the output terminal of the inverter to the gate of the NMOS transistor 9.

As discussed above, the impedance component Z1 is electrically connected between the ground voltage lines VSS1IO and VSS1P. The impedance value of the impedance component Z1 should thus be maintained at as high an impedance as possible to reduce the generation and transmission of noise. In this circuit, however, electrostatic discharge according to the charged device model may cause dielectric breakdown as a negative voltage or a ground voltage is applied to an external pin I/O1 when the integrated circuit memory device is strongly charged. This electrostatic discharge may cause the NMOS transistor 9 to operate as an NPN bipolar transistor when a negative voltage or a ground voltage is applied to the output pin I/O1 because the two ground voltage lines VSS1IO and VSS1P may be strongly charged. In other words, the source, drain, and bulk substrate of the NMOS transistor 9 may serve as the collector, emitter, and base of the NPN bipolar transistor. The NMOS transistor 9 may thus become a common emitter circuit allowing current to flow from the ground voltage line VSS1IO to the output pin I/O1.

The NMOS transistor 5 may also operate as an NPN bipolar transistor thus allowing current to flow from the ground voltage line VSS1P to the node DOD1. As this current cannot flow through the gate of the transistor 9 to the output pin I/O1, the potential of the node DOD1 may increase to the same level as that of the ground voltage line VSS1P. Accordingly, a relatively high potential difference may be generated between the node DOD1 and the output pin I/O1. This potential difference may be maintained for a relatively long period of time because the current may not flow rapidly from the ground voltage line VSS1P and the node DOD1 to the ground voltage line VSS1IO through the output pin I101. This potential difference may thus generate ESD stress thereby damaging or destroying the gate insulator of the NMOS transistor 9 between the node DOD1 and the output pin I/O1. One approach to reducing the ESD stress problem is to reduce the impedance component which is provided between the two ground voltage lines VSS1IO and VSS1P.

Figure 2:
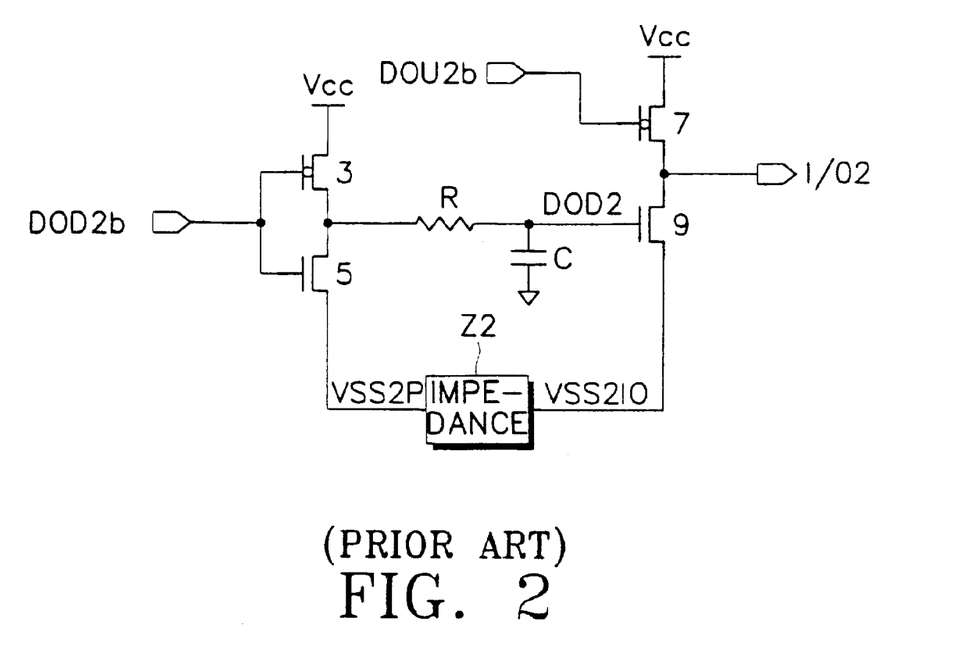
FIG. 2 is a circuit diagram of a second data output circuit according to the prior art.

FIG. 2 is a circuit diagram of a second data output circuit according to the prior art. As shown, this data output circuit includes a signal delay circuit including a resistor R and a capacitor C connected to the node DOD2 to reduce the potential difference across the gate dielectric layer of the NMOS transistor 9. The resistor and capacitor thus provide an RC circuit producing a signal delay. With this circuit configuration, however, the potential difference between the node DOD2 and the output pin I/O2 may be reduced, but ESD stress may still occur when the device is more strongly charged. Furthermore, the signal transmission capability of the node DOD2 is lowered as a result of the RC delay of the signal delay circuit thus reducing the performance of the output driver.

Figure 3:
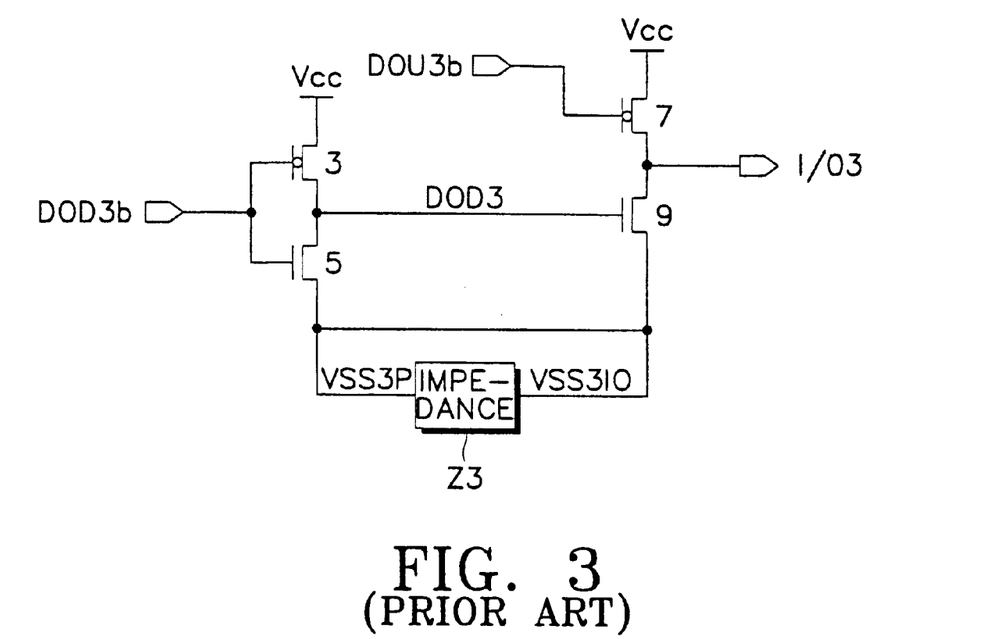
FIG. 3 is a circuit diagram of a third data output circuit according to the prior art.

FIG. 3 is a circuit diagram of third data output circuit according to the prior art. In this circuit, the impedance between the two ground voltage lines VSS1IO and VSS1P is reduced by providing an electrical connection therebetween. In other words, the two ground voltage lines are combined into one line. Accordingly, current may flow rapidly from the two ground voltage lines VSS3IO and VSS3P to the output pin I/O3 because the NMOS transistor 9 operates as a NPN bipolar transistor as discussed above and because the two ground voltage lines are directly connected to each other. It is thus possible to reduce the instantaneous generation of high potential differences. A noise signal generated at the output driver, however, may be directly applied to the output terminal of the periphery circuit so that noise signals reduce the performance of the device.

SUMMARY OF THE INVENTION

It is therefore an object of the present invention to provide improved data output circuits and methods.

It is another object of the present invention to provide data output circuits having increased resistance to stresses resulting from electrostatic discharge.

It is still another object of the present invention to provide data output circuits which reduce the transmission of electrical noises generated therein.

It is yet another object of the present invention to provide data output circuits having reduced signal transmission delays.

These and other objects are provided according to the present invention by a data output circuit for an integrated circuit memory device including a periphery circuit connected between a supply voltage and a first ground voltage line and an output driver connected between a supply voltage and a second ground voltage line. The periphery circuit receives a first input signal and generates a first output signal on a node responsive to a first input signal, and the output driver receives a second input signal and the first output signal, and generates a second output signal on an output pin in response thereto. In addition, a discharge circuit is coupled with the first ground voltage line wherein the discharge circuit allows current to flow from the first ground voltage line and wherein the discharge circuit blocks current flow to the first ground voltage line. Accordingly, the discharged circuit can be used to dissipate transient currents which may occur as a result of electrostatic discharge thereby reducing damage caused by the electrostatic discharge.

More particularly, the discharge circuit can be coupled between the first and second ground voltage lines so that current is allowed to flow from the first ground voltage line to the second ground voltage line when a voltage difference therebetween exceeds a predetermined threshold. In addition, the discharge circuit blocks current flow from the second ground voltage line to the first ground voltage line thereby reducing the transmission of noise from the output driver to other portions of the output circuit. Alternately, the discharged circuit can be coupled between the first ground voltage line and the output pin so that the discharge circuit allows current to flow from the first ground voltage line to the output pin when a voltage difference therebetween exceeds a predetermined threshold. The discharge circuit blocks current flow from the output pin to the first ground voltage line to again reduce the transmission of noise.

More particularly, the discharged circuit can include a diode. This diode can be a conventional diode or a diode connected NMOS transistor with a first source/drain and a gate coupled with the first ground voltage line. Furthermore, the discharge circuit can include a plurality of serially coupled diodes. An impedance circuit can also be coupled between the first and second ground lines to reduce the transmission of noise.

The periphery circuit can include first and second periphery MOS transistors serially connected between the supply voltage and the first ground voltage line wherein the first input signal is provided to gates of each of the periphery MOS transistors, and wherein the output node is connected between the first and second periphery MOS transistors. The output driver can include first and second driver MOS transistors serially coupled between the supply voltage and the second ground voltage line, wherein the second input signal is provided to a gate of the first driver MOS transistor, wherein the output node is coupled with a gate of the second driver MOS transistor, and wherein an output pin is coupled between the first and second driver MOS transistors.

The data output circuits of the present invention can thus be used to reduce damage to the memory device which may be caused by electrostatic discharge. In addition, these output circuits can reduce transmission delays and reduce the transmission of noise.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 4:
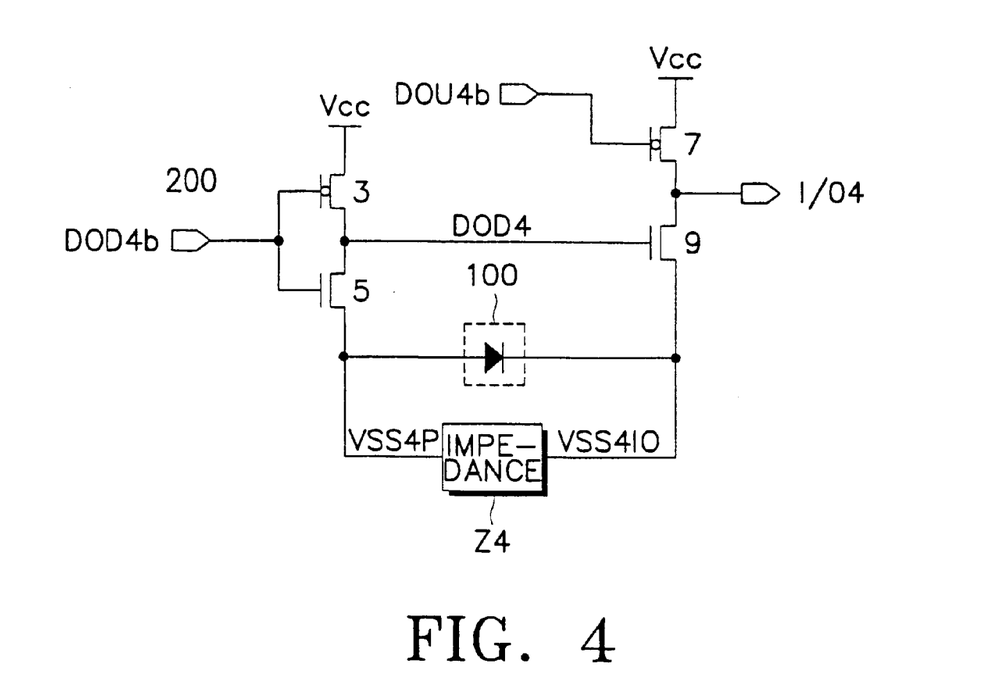
FIG. 4 is a circuit diagram of a first data output circuit according to the present invention.

FIG. 4 is a circuit diagram of an output circuit for a memory device according to the present invention. As shown, a high impedance component Z4 and a diode 100 are connected in parallel between a ground voltage line VSS4P and a ground voltage line VSS4IO. Moreover, the ground voltage line VSS4P is connected to a periphery circuit, and the ground voltage line VSS4IO is connected to an output driver. The diode 100 turns on when a difference between a potential of the ground voltage line VSS4P and the ground voltage line VSS4IO exceeds a predetermined threshold voltage (Vb) of the diode 100. When the voltage of the ground voltage line VSS4P exceeds that of the ground voltage line VSS4IO by the predetermined voltage threshold, current flows from the ground voltage line VSS4P to the ground voltage line VSS4IO. In other words, the impedance between the two ground voltage lines is reduced when the voltage of the ground voltage line VSS4P exceeds that of the ground voltage line VSS4IO by the predetermined threshold voltage of the diode effectively bypassing the high impedance component Z4.

Accordingly, the potential difference between the node DOD4 and the output pin I/O4 can be reduced when the potential of the node DOD4 exceeds that of the output pin I/O4 as a result of the diode 100. The output circuit can thus more effectively reduce ESD stress. Furthermore, the diode 100 does not turn on when the potential of the ground voltage line VSS4IO is higher than that of the ground voltage line VSS4P because the diode is reversed biased. Transmission of noise signals from the output driver to the output terminals of the periphery circuits-can thus be reduced.

Figure 5A:
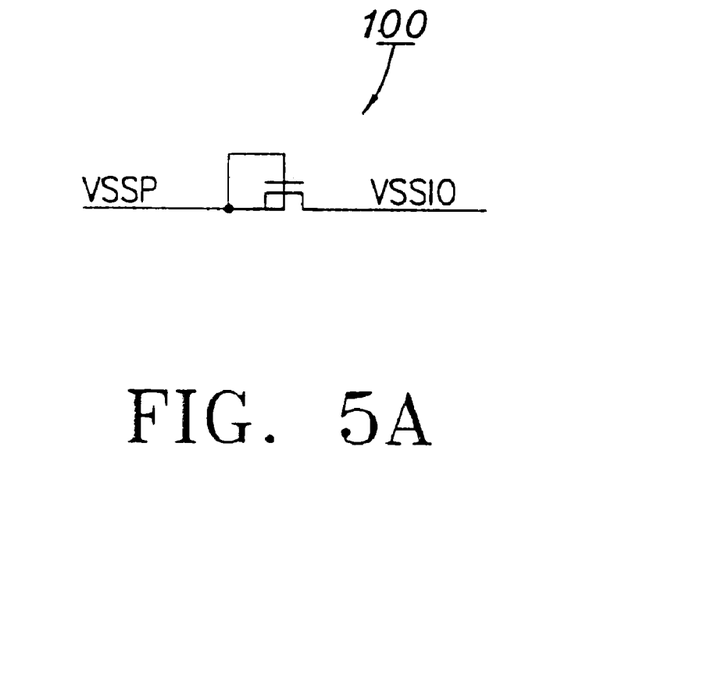
FIGS. 5a and 5b are circuit diagrams illustrating various connections of a diode according to FIG. 4.
Figure 5B:
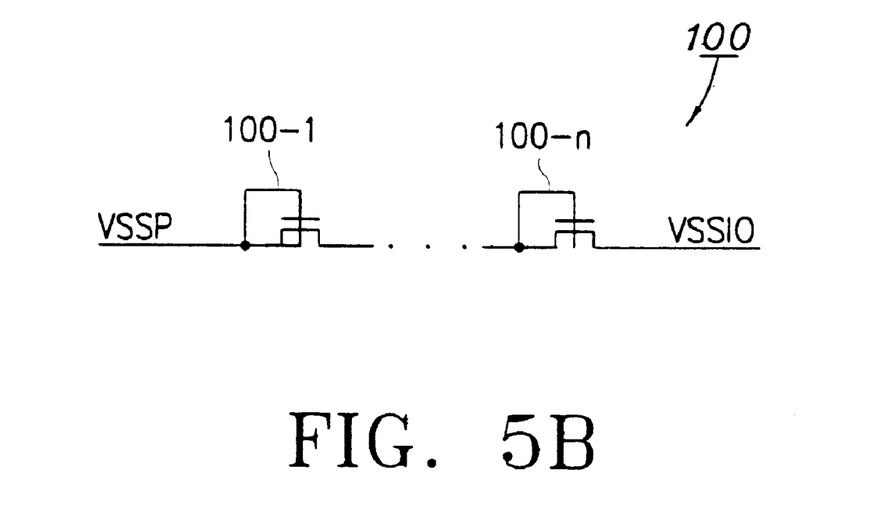

The diode can be a conventional P-N junction diode. The diode can also include a plurality of serially connected diodes. Alternately, the diode can include a diode connected NMOS transistor wherein the gate electrode and one of the source/drain electrodes are connected as shown in FIG. 5a. When using the structure of FIG. 5a, the first source/drain electrode and the gate electrode are both connected to the ground voltage line VSS4P, and the second source/drain electrode is connected to the ground voltage line VSSIO. The diode 100 thus has a threshold voltage that is equal to the threshold voltage of the NMOS transistor. As shown in FIG. 5b, a plurality of diode connected NMOS transistors can also be used. When using a plurality of serially connected conventional diodes or diode connected transistors, the equivalent threshold voltage Vb of the circuit is equal to the sum of the threshold voltages of the serially connected elements. The threshold voltage Vb of the circuit can thus be adjusted by controlling the number of serially connected elements.

Figure 6:
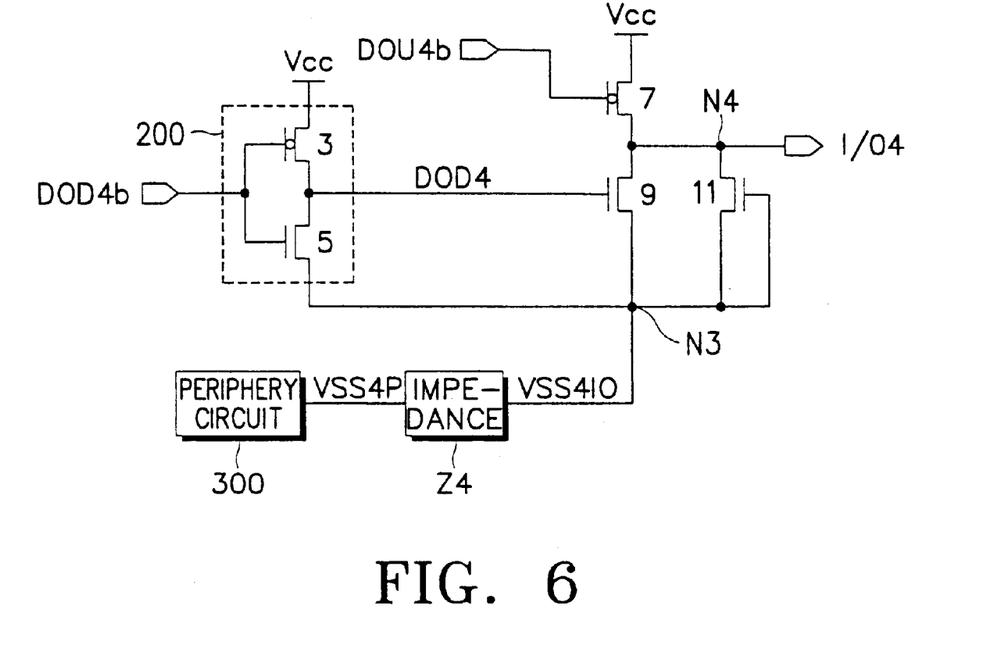
FIG. 6 is a circuit diagram of a second data output circuit according to the present invention.

FIG. 6 is a circuit diagram of a second data output circuit according to the present invention. As shown, the inverter configured periphery circuit 200 is an output buffer, and this output buffer is connected to the ground voltage line VSS4IO which is also connected to the output driver. In other words, the output buffer 200 and the output driver share a common ground voltage line VSS4IO. The data output circuit may also include one or more other periphery circuits 300 wherein one or more of these other periphery circuits are connected to a second ground voltage line VSS4P and wherein a high impedance component Z4 is coupled between the ground voltage line VSS4P and the ground voltage line VSS4IO. Accordingly, a potential difference at the gate of the NMOS transistor 9 can be reduced because transient current which flows from the ground voltage line VSS4IO to a first connection node DOD4 as a result of the bipolar transistor operation of the NMOS transistor 5 can flow to the output pin I/O4 through the output driver. This operation can reduce dielectric breakdown in the NMOS transistor 9 of the output driver as a result of ESD.

The source and drain of NMOS transistor 9 are respectively connected to nodes N3 and N4. In addition, a discharging transistor such as a diode connected NMOS transistor 11 is added to the circuit to discharge current flowing through the node DOD4 to the output pin I/O4. As shown, the diode connected NMOS transistor 11 includes a gate connected to the source of NMOS transistor so that the NMOS transistor 11 turns on when the potential of node N3 exceeds that of node N4 by the threshold voltage of the NMOS transistor 11. Alternately, a conventional diode can be connected between nodes N3 and N4. The diode connected NMOS transistor 11 thus reduces dielectric breakdown due to transient currents concentrated on the NMOS transistor 9.

As discussed above, the other periphery circuits 100 are connected to the ground voltage line VSS4P. Accordingly, of the periphery circuits, only the output buffer 200 is connected to the ground voltage line VSS4IO together with the output driver. The other periphery circuits 300 are connected to the ground voltage line VSS4P so that transient currents can be rapidly discharged from the output node DOD4 of the output buffer 200 to the output pin I/O4 while reducing the transmission of noise from the output driver to the other periphery circuits 300.

Figure 7:
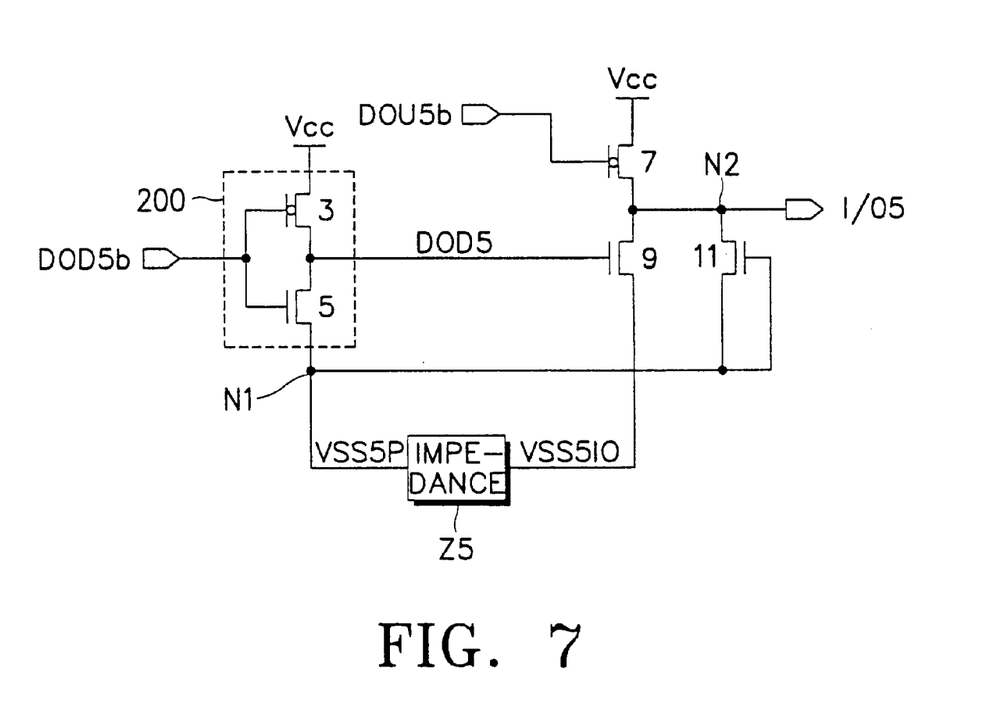
FIG. 7 is a circuit diagram of a third data output circuit according to the present invention.

FIG. 7 is a circuit diagram of a third data output circuit according to the present invention. As shown, a high impedance component Z5 is coupled between the ground voltage lines VSS5P and VSS5IO. Moreover, the ground voltage line VSS5P is connected to the source of the NMOS transistor 5 of the output buffer 200, and the ground voltage line VSS5IO is connected to the source of the NMOS transistor 9 of the output driver. The output circuit also includes a discharging circuit such as the diode connected NMOS transistor 11. As shown, the source and drain of the NMOS transistor 11 are respectively connected to the nodes N1 and N2, and the gate is connected to the node N1.

In this configuration, the NMOS transistor 11 and the NMOS transistor 5 are both connected to the same ground line VSS5P. It is thus possible to discharge transient currents which flow from the ground voltage line VSS5P the node DOD5 as a result of the NPN bipolar transistor operation of the NMOS transistor 5 through the output pin I/O5 rapidly. This circuit can thus reduce potential differences at the gate of the NMOS transistor 9 thereby reducing ESD dielectric breakdown and protecting the data output circuit. It is also noted that transient currents flowing through the node DOD5 can be more rapidly discharged using the discharging path through the discharging transistor 11 as well as the path through the ground voltage line VSS5P.

According to the data output circuits of the present invention, ESD stresses can be reduced without significant reductions in circuit performance. In particular, the ESD stresses can be reduced without significantly increasing the transmission of noises from the output driver to the output terminals of the periphery circuits. Furthermore, it is possible to reduce the generation of dielectric breakdown due to the transient current between the output terminals of the periphery circuits and output driver. Accordingly, ESD-resistant output circuits can be realized using the discharging path through the discharging transistor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A data output circuit for an integrated circuit memory device, said data output circuit comprising:

a periphery circuit coupled between a supply voltage and a first ground voltage line wherein said periphery circuit receives a first input signal and generates a first output signal on a node responsive to said first input signal wherein said periphery circuit comprises first and second periphery MOS transistors serially coupled between said supply voltage and said first ground voltage line, wherein said first input signal is provided to gates of each of said periphery MOS transistors, and wherein said output node is connected between said first and second periphery MOS transistors wherein said first periphery MOS transistor comprises a PMOS transistor and said second periphery MOS transistor comprises an NMOS transistor wherein said first periphery MOS transistor is coupled to said supply voltage and said second periphery MOS transistor is coupled to said first ground voltage line;

an output driver coupled between said supply voltage and a second ground voltage line wherein said output driver receives a second input signal and said first output signal, and generates a second output signal on an output pin in response thereto wherein said output driver comprises first and second driver MOS transistors serially coupled between said supply voltage and said second ground voltage line, wherein said second input signal is provided to a Rate of said first driver MOS transistor, wherein said output node is coupled with a gate of said second driver MOS transistor, and wherein an output pin is coupled between said first and second driver MOS transistors wherein said first driver MOS transistor comprises a PMOS transistor and said second driver MOS transistor comprises an NMOS transistor wherein said first driver MOS transistor is coupled to said supply voltage and said second driver MOS transistor is coupled to said second ground voltage line; and a discharge circuit coupled to said first ground voltage line wherein said discharge circuit allows a forward current to flow from said first ground voltage line and wherein said discharge circuit blocks a reverse current flow to said first ground voltage line.

2. A data output circuit according to claim 1 wherein said discharge circuit is coupled between said first and second ground voltage lines so that said forward current is allowed to flow from said first ground voltage line to said second ground voltage line when a voltage difference therebetween exceeds a predetermined threshold and wherein said discharge circuit blocks said reverse current flow from said second ground voltage line to said first ground voltage line.

3. A data output circuit for an integrated circuit memory device, said data output circuit comprising:

a periphery circuit coupled to a first ground voltage line wherein said periphery circuit receives a first input signal and generates a first output signal on a node responsive to said first input signal;

an output driver coupled to a second ground voltage line wherein said output driver receives a second input signal and said first output signal, and generates a second output signal on an output pin in response thereto; and a discharge circuit coupled to said first ground voltage line wherein said discharge circuit allows a forward current to flow from said first ground voltage line and wherein said discharge circuit blocks a reverse current flow to said first ground voltage line wherein said discharge circuit is coupled between said first ground voltage line and said output pin so that said discharge circuit allows said forward current to flow from said first ground voltage line to said output pin when a voltage difference therebetween exceeds a predetermined threshold and so that said discharge circuit blocks said reverse current flow from said output pin to said first ground voltage line.

4. A data output circuit according to claim 3 further comprising:

an impedance circuit coupled between said first and second ground voltage lines.

5. A data output circuit according to claim 3 wherein said discharge circuit comprises a diode.

6. A data output circuit according to claim 5 wherein said diode comprises a MOS transistor with a first source/drain and a gate coupled with said first ground voltage line.

7. A data output circuit according to claim 5 wherein said discharge circuit comprises a plurality of serially coupled diodes.

8. A data output circuit according to claim 3 wherein said periphery circuit comprises an output buffer.

9. A data output circuit according to claim 2 further comprising:

an impedance circuit coupled between said first and second ground voltage lines in parallel with said discharge circuit.

10. A data output circuit according to claim 2 wherein said discharge circuit comprises a diode.

11. A data output circuit according to claim 10 wherein said diode comprises an MOS transistor with a first source/ drain and a gate coupled with said first ground voltage line and a second source/drain coupled with said second ground voltage line.

12. A data output circuit according to claim 10 wherein said discharge circuit comprises a plurality of serially coupled diodes.

13. A data output circuit according to claim 1 wherein said periphery circuit comprises an output buffer.

14. A data output circuit for an integrated circuit memory device, said data output circuit comprising:

a periphery circuit coupled between a supply voltage and a first ground voltage line wherein said periphery circuit receives a first input signal and generates a first output signal on a node responsive to said first input signal;

an output driver coupled between said supply voltage and a second ground voltage line wherein said output driver receives a second input signal and said first output signal and generates a second output signal on an output pin in response thereto; and a discharge circuit coupled between said first ground voltage line and said output pin wherein said discharge circuit allows a forward current to flow from said first ground voltage line to said output pin when a voltage difference therebetween exceeds a predetermined threshold and wherein said discharge current blocks a reverse current flow from said output pin to said first ground voltage line wherein said discharge circuit comprises a diode wherein said diode comprises an MOS transistor with a first source/drain and a gate coupled with said first ground voltage line and a second source/drain coupled with said output pin.

15. A data output circuit according to claim 14 wherein said first and second ground voltage lines are electrically connected.

16. A data output circuit according to claim 15 further comprising:

a second periphery circuit coupled between said supply voltage and a third ground voltage line; and an impedance circuit electrically coupled between said third ground voltage line and said electrical connection of said first and second ground voltage lines.

17. A data output circuit according to claim 14 wherein said discharge circuit comprises a plurality of serially coupled diodes.

18. A data output circuit according to claim 14 wherein said periphery circuit comprises an output buffer.

19. A data output circuit for an integrated circuit memory device, said data output circuit comprising:

a periphery circuit coupled between a supply voltage and a first ground voltage line wherein said periphery circuit receives a first input signal and generates a first output signal on a node responsive to said first input signal wherein said periphery circuit comprises first and second periphery MOS transistors serially coupled between said supply voltage and said first ground voltage line, wherein said first input signal is provided to said gates of each of said periphery MOS transistors, and wherein said output node is connected between said first and second periphery MOS transistors wherein said first periphery MOS transistor comprises a PMOS transistor and said second periphery MOS transistor comprises an NMOS transistor wherein said first periphery MOS transistor is coupled to said supply voltage and said second periphery MOS transistor is coupled to said first ground voltage line;

an output driver coupled between said supply voltage and a second ground voltage line wherein said output driver receives a second input signal and said first output signal and generates a second output signal on an outut pin in response thereto wherein said output driver comprises first and second driver MOS transistors serially coupled between said supply voltage and said second ground voltage line, wherein said second input signal is provided to a gate of said first driver MOS transistor, wherein said output node is coupled with a gate of said second driver MOS transistor, and wherein an output pin is coupled between said first and second driver MOS transistors wherein said first driver MOS transistor comprises a PMOS transistor and said second driver MOS transistor comprises an NMOS transistor wherein said first driver MOS transistor is coupled to said supply voltage and said second driver MOS transistor is coupled to said second ground voltage line and a discharge circuit coupled between said first ground voltage line and said output pin wherein said discharge circuit allows a forward current to flow from said first ground voltage line to said output pin when a voltage difference therebetween exceeds a predetermined threshold and wherein said discharge current blocks a reverse current flow from said output pin to said first ground voltage line.

20. A data output circuit for an integrated circuit device comprising:

an output driver;

a periphery circuit for receiving an input signal and coupled to said output driver;

a first ground voltage line coupled to said periphery circuit;

a second ground voltage line coupled to said output driver; and a discharge circuit for electrostatic discharge coupled between said first ground voltage line and an output pin of said output driver.

21. A data output circuit according to claim 20 wherein said discharge circuit allows a forward current to flow from said first ground voltage line to said output pin when a voltage difference therebetween exceeds a predetermined threshold.

22. A data output circuit according to claim 20 wherein said discharge circuit comprises a MOS transistor with a first source/drain coupled with said first ground voltage line and a second source/drain coupled with said output pin.

23. A data output circuit according to claim 22 wherein a gate of said MOS transistor is coupled with said first ground voltage line.

24. A data output circuit for an integrated circuit memory device, said data output circuit comprising:

a periphery circuit coupled to a first ground voltage line wherein said periphery circuit receives a first input signal and generates a first output signal;

an output driver coupled to a second ground voltage line wherein said output driver receives said first output signal, and generates a second output signal on an output pin; and a discharge circuit for electrostatic discharge coupled between said first ground voltage line and said output pin so that said discharge circuit allows a forward current to flow from said first ground voltage line to said output pin when a voltage difference therebetween exceeds a predetermined threshold.

25. A data output circuit according to claim 24 further comprising:

an impedance circuit coupled between said first and second ground voltage lines.

26. A data output circuit according to claim 24 wherein said discharge circuit comprises a diode.

27. A data output circuit according to claim 25 wherein said diode comprises a MOS transistor with a first source/drain coupled with said first ground voltage line and a second source/drain coupled with said output pin.

28. A data output circuit according to claim 27 wherein a gate of said MOS transistor is coupled with said first ground voltage line.

29. A data output circuit according to claim 26 wherein said discharge circuit comprises a plurality of serially coupled diodes.

30. A data output circuit according to claim 24 wherein said periphery circuit comprises an output buffer.

31. A data output circuit for an integrated circuit memory device, said data output/circuit comprising:

a periphery circuit coupled to a first ground voltage line wherein said periphery circuit receives a first input signal and generates a first output signal;

an output driver coupled to a second ground voltage line wherein said output driver receives said first output signal and generates a second output signal on an output pin; and a discharge circuit for electrostatic discharge coupled between said first and second ground voltage line so that said discharge circuit allows a forward current to flow from said first ground voltage line to said second ground voltage line when a voltage difference therebetween exceeds a predetermined threshold.

32. A data output circuit according to claim 31 further comprising: an impedance circuit coupled between said first and second ground voltage lines in parallel with said discharge circuit.

33. A data output circuit according to claim 31 wherein said discharge circuit comprises a diode.

34. A data output circuit according to claim 33 wherein said diode comprises a MOS transistor with a first source/drain and a gate coupled with said first ground voltage line and a second source/drain coupled with said second ground voltage line.

35. A data output circuit according to claim 33 wherein said discharge circuit comprises a plurality of serially coupled diodes.

36. A data output circuit according to claim 31 wherein said periphery circuit comprises an output buffer.

37. An integrated circuit memory device, having a data output circuit comprising:

a first periphery circuit coupled to a first ground voltage line wherein said periphery circuit receives a first input signal and generates a first output signal;

an output driver coupled to said first ground voltage line wherein said output driver receives said first output signal and generates a second output signal on an output pin;

a second periphery circuit coupled to a second ground voltage line; and a discharge circuit for electrostatic discharge coupled between said first ground voltage line and said output pin so that said discharge circuit allows a forward current to flow from said first ground voltage line to said output pin when a voltage difference therebetween exceeds a predetermined threshold.

38. An integrated circuit memory device according to claim 37 further comprising: an impedance circuit coupled between said first and second ground voltage lines.

39. An integrated circuit memory device according to claim 37 wherein said discharge circuit comprises a diode.

40. An integrated circuit memory device according to claim 39 wherein said diodes comprises a MOS transistor with a first source/drain and a gate coupled with said first ground voltage line and a second source/drain coupled with said output pin.

41. An integrated circuit memory device according to claim 39 wherein said discharge circuit comprises a plurality of serially coupled diodes.

42. An integrated circuit memory device according to claim 37 wherein said first periphery circuit comprises first and second periphery MOS transistors serially coupled between a supply voltage and said first ground voltage line, wherein said first input signal is provided to said gates of each of said periphery MOS transistors, and wherein said output node is connected said first and second pheriphery MOS transistors.

* * * * *